United States Patent
Wang et al.

(10) Patent No.: US 9,478,440 B2
(45) Date of Patent: Oct. 25, 2016

(54) LOW-PRESSURE CHEMICAL VAPOR DEPOSITION APPARATUS AND THIN-FILM DEPOSITION METHOD THEREOF

(71) Applicant: Wuxi China Resources Huajing Microelectronics Co., Ltd., Wuxi, Jiangsu (CN)

(72) Inventors: Xunhui Wang, Jiangsu (CN); Xiao Wu, Jiangsu (CN); Qijun Guo, Jiangsu (CN); Jianchao Fan, Jiangsu (CN)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 14/363,719

(22) PCT Filed: Dec. 3, 2012

(86) PCT No.: PCT/CN2012/085713
§ 371 (c)(1),
(2) Date: Jun. 6, 2014

(87) PCT Pub. No.: WO2013/083016
PCT Pub. Date: Jun. 13, 2013

(65) Prior Publication Data
US 2014/0322900 A1    Oct. 30, 2014

(30) Foreign Application Priority Data
Dec. 7, 2011 (CN) .......................... 2011 1 0402580

(51) Int. Cl.
*C23C 16/455*    (2006.01)
*C23C 16/448*    (2006.01)
(Continued)

(52) U.S. Cl.
CPC ....... *H01L 21/32155* (2013.01); *C23C 16/448* (2013.01); *C23C 16/453* (2013.01); *C23C 16/455* (2013.01); *C23C 16/45502* (2013.01)

(58) Field of Classification Search
CPC ........... H01L 29/7394; H01L 21/0262; C23C 16/45502; C23C 16/45519; C23C 16/45574; C23C 16/54; C23C 16/448; C23C 16/453; C23C 16/455

USPC ....... 438/488, 503, 507, 711, 727, 730, 758; 257/E21.101, E21.16, E21.267, 257/E21.274
See application file for complete search history.

(56) References Cited

U.S. PATENT DOCUMENTS 4,825,809 A * 5/1989 Mieno ................... C23C 16/455
                                                        118/715
5,091,210 A * 2/1992 Mikoshiba ............ C23C 16/452
                                                        427/123
(Continued)

FOREIGN PATENT DOCUMENTS

CN    1277145 A    12/2000
CN    202380075 U    8/2012
(Continued)

OTHER PUBLICATIONS

Adachi., English Machine Translated of JP Publication No. 2007-207905, Aug. 16, 2007; (Machine Translated Dec. 29, 2014).*
(Continued)

*Primary Examiner* — Mohsen Ahmadi
(74) *Attorney, Agent, or Firm* — Wood, Phillips, Katz, Clark & Mortimer

(57) ABSTRACT

A low-pressure chemical vapor deposition (LPCVD) apparatus and a thin-film deposition method thereof. The apparatus comprises a reaction furnace, having reaction gas input pipelines respectively arranged at a furnace opening part and a furnace tail part. During thin film deposition, each reaction gas is synchronously introduced into the reaction furnace through the input pipeline at the furnace opening part and the input pipeline at the furnace tail part.

11 Claims, 1 Drawing Sheet

(51) Int. Cl.
*C23C 16/453* (2006.01)
*H01L 21/3215* (2006.01)

(56) References Cited

U.S. PATENT DOCUMENTS

| | | | | |
|---|---|---|---|---|
| 5,180,687 A | * | 1/1993 | Mikoshiba | H01L 21/28562 257/E21.171 |
| 5,510,146 A | * | 4/1996 | Miyasaka | 438/151 |
| 5,558,910 A | * | 9/1996 | Telford | C23C 16/42 148/DIG. 19 |
| 6,211,094 B1 | * | 4/2001 | Jun | H01L 22/26 257/E21.528 |
| 6,258,690 B1 | * | 7/2001 | Zenke | H01L 28/40 257/E21.008 |
| 6,306,216 B1 | * | 10/2001 | Kim | C23C 16/4412 118/715 |
| 6,350,488 B1 | | 2/2002 | Lee et al. | |
| 7,507,615 B2 | * | 3/2009 | Yamazaki | C23C 14/568 257/E21.561 |
| 2003/0221616 A1 | * | 12/2003 | Carpenter | C23C 16/45557 118/715 |
| 2008/0311731 A1 | * | 12/2008 | Kim | C23C 16/24 438/488 |
| 2009/0159004 A1 | * | 6/2009 | Yoshioka | C23C 16/45578 118/715 |
| 2009/0191718 A1 | * | 7/2009 | Nakashima | C23C 16/345 438/758 |
| 2009/0325365 A1 | * | 12/2009 | Park | C30B 25/00 438/478 |
| 2011/0005461 A1 | * | 1/2011 | Vandermeulen | C23C 16/511 118/723 MA |

FOREIGN PATENT DOCUMENTS

| JP | 58100669 A | 6/1983 |
|---|---|---|
| JP | 2007207905 A | 8/2007 |

OTHER PUBLICATIONS

International Search Report for corresponding PCT application No. PCT/CN2012/085713.

* cited by examiner

LOW-PRESSURE CHEMICAL VAPOR DEPOSITION APPARATUS AND THIN-FILM DEPOSITION METHOD THEREOF

The present application claims priority to Chinese Application No. 201110402580.3 entitled "Low-Pressure Chemical Vapor Deposition Apparatus and Thin-film Deposition Method thereof" filed with SIPO of China on Dec. 7, 2011, which is hereby incorporated by reference in its entirety.

TECHNICAL FIELD

The present invention belongs to the field of semiconductor thin film preparation and relates to a Low-pressure chemical vapor deposition (LPCVD) apparatus, particularly to a LPCVD apparatus having reaction gas input pipelines arranged at both furnace opening part and furnace tail part and a method for thin film deposition using the same.

BACKGROUND ART

LPCVD apparatus is widely used in semiconductor thin film preparation, for example, LPCVD apparatus is used for deposition of polycrystalline thin-film layer in DMOS preparation.

FIG. 1 illustrates basic structure of LPCVD apparatus of the prior art. As shown in FIG. 1, LPCVD 10 includes a reaction furnace, which is often referred to as furnace tube. The wafers to be deposited are placed in the reaction furnace, and reaction gas is ventilated before semiconductor thin films of various properties are generated under specific process parameters. Conventionally, the reaction furnace includes furnace opening part 110, furnace tail part 130 and furnace body part 120 therebetween. The wafers are sent in the reaction furnace through the opening of the furnace opening part 110. Specially, wafer Cassette 900 is used to carry wafers 910 to easily go into or out of the reaction furnace. As shown in FIG. 1, in the thin film growth process, the wafer cassette 900 carrying the wafers 910 is placed between the furnace opening part 110 and the furnace tail part 130, i.e. being placed at the furnace body part. Meanwhile, a port is arranged at the furnace tail part 130 to connect a vacuum pump to vacuum the reaction furnace after the wafers 910 are placed into the reaction furnace but before the reaction gas is ventilated. At the furnace opening part 110 is arranged a reaction gas input pipeline 140, on which can be arranged with flowmeter 141 and pneumatic valve 142. During the semiconductor thin film growth, the reaction gas, for example, $SiH_4$ gas for preparation of polycrystalline silicon, is continuously ventilated into the reaction furnace through the reaction gas input pipeline 140.

However, when the LPCVD in FIG. 1 is used for semiconductor thin film deposition, there is a disadvantage of uneven characters of the thin films between the wafers, for example, uneven thickness of the thin films between the wafers, uneven grain size of the thin films between the wafers, etc. This is because the distances of multi wafers to the furnace opening part 110 are not equal, and the reaction gas introduced from the furnace opening part 110 is difficult to evenly distribute for each of the wafers, such that the reaction conditions for multi wafers 910 in the wafer cassette 900 are different to some extent, finally resulting in the disadvantage above.

There are two methods to avoid the above disadvantage as much as possible. The first method is to reduce the number of the wafers for the thin film deposition per batch, for example, to reduce the number to 70 pieces per batch, thereby the characteristic difference of the thin films between the wafers in the same batch will be relatively smaller. The second method is to set a temperature difference between the furnace tail part and the furnace opening part, i.e. adjusting temperature distribution of the furnace tube. For example, the temperature at furnace tail is adjusted to be 20° C. higher than that of the furnace opening part, thereby reducing the thickness difference of the thin films between the wafers in the same batch.

The above-mentioned first method will greatly limit the efficiency of thin film deposition of LPCVD, usually only 75 pieces per batch. The second method will lead to greater difference of grain size of deposited thin films between the wafers in the same batch; for example, grain sizes of polysilicon thin films are inconsistent.

In view of the above, it is necessary to develop a novel LPCVD apparatus.

SUMMARY OF THE INVENTION

The object of the present invention is to improve consistency of thin film growth of the wafers in the same batch.

To achieve the above or other object, the present invention provides an LPCVD apparatus, which includes a reaction furnace including a furnace opening part and a furnace tail part, wherein the part between the furnace opening part and the furnace tail part is used to accommodate multi wafers, and wherein reaction gas input pipelines are arranged at both the furnace opening part and the furnace tail part.

According to an embodiment of the LPCVD apparatus provided by the present invention, when there are n kinds of reaction gases for the chemical vapor deposition, at both the furnace opening part and the furnace tail part are arranged n reaction gas input pipelines, wherein n is an integer equal to 1 or greater.

Preferably, each of the reaction gas input pipelines is arranged with a pneumatic valve.

Preferably, each of the reaction gas input pipeline is arranged with a flow-meter.

The reaction furnace includes a furnace body part, at which are placed the multi wafers.

Preferably, the wafers are carried by a wafer cassette.

Preferably, the number of the multi wafers is ranged from 150 to 200.

One aspect of the present invention provides a method for thin film deposition, wherein the low pressure chemical vapor deposition apparatus according to any of the above is used to deposit thin films on the multi wafers, and wherein each of the reaction gases is synchronously introduced into the reaction furnace through the input pipelines at the furnace opening part and the input pipelines at the furnace tail part during the thin film deposition.

In a method for thin film deposition according to an embodiment of the present invention, the thin film is a polycrystalline silicon thin film.

Specifically, the reaction gas is SiH4.

Preferably, the number of the multi wafers is ranged from 150 to 200.

Specifically, the pneumatic valves arranged at each of the reaction gas input pipelines respectively are used to control the flow amount of the reaction gases.

The present invention has the following technical effects: at the furnace tail part being also arranged the reaction gas input pipeline, can prevent uneven distribution resulted from exhaustion of reaction gas and improve the uniformity of reaction gas condition in the reaction furnace, thereby improving production consistency of the thin films of the wafers in the same batch; meanwhile, since there is no need to adjust temperature distribution of the reaction furnace, the temperature in the reaction furnace can be set evenly, thereby the grain sizes are well consistent. Further, the number of the wafers in reaction furnace in the same batch can be increased greatly, leading to high production efficiency and low production cost.

DESCRIPTION OF DRAWINGS

The above and other objects and advantages of the present invention will be more fully understood referring to the following detailed description in combination with the accompanying drawings, wherein the same or similar elements are indicated by the same reference numbers.

DETAILED DESCRIPTION

The following describes some of the possible embodiments of the present invention, aiming to provide a basic understanding of the present invention but not to confirm the key or critical elements of the present invention or define the scope to be protected. It is easy to understand, according to the technical solution of the present invention, those skilled in the art can develop other alternative embodiments without changing the essence of the present invention. Therefore, the following detailed embodiments and drawings are only exemplary description of the technical solutions of the present invention and should not be regarded as entirety of the present invention or limitation or restriction to the technical solution of the present invention.

Figure 1:
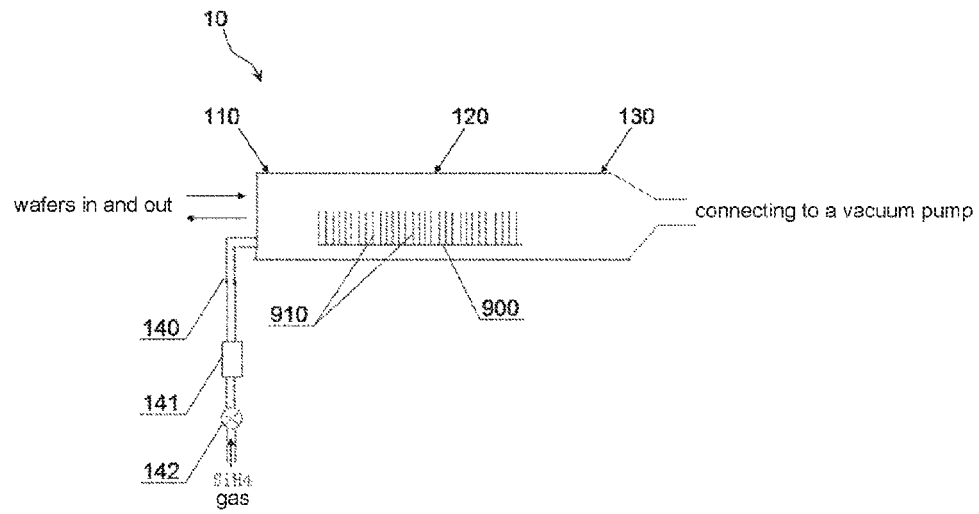
FIG. 1 is a diagram showing basic structure of a LPCVD apparatus o the prior art.
Figure 2:
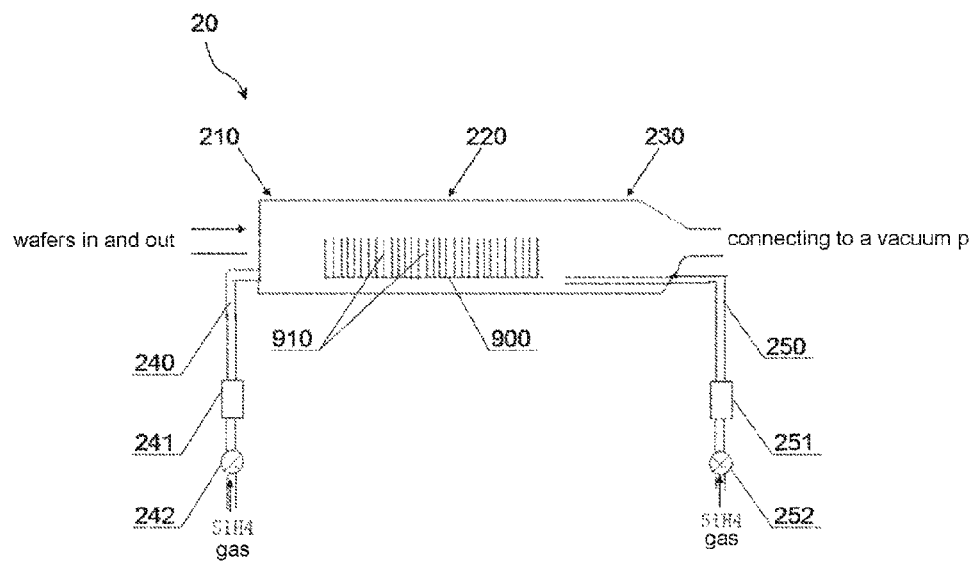
FIG. 2 is a diagram showing basic structure of a LPCVD apparatus according to an embodiment of the present invention.

FIG. 2 shows a diagram of basic structure of a LPCVD Apparatus according to an embodiment of the present invention. In this embodiment, LPCVD apparatus 20 is used to prepare a polysilicon thin film layer in DMOS. However, those skilled in the art will understand, LPCVD can be used to prepare various semiconductor thin films and its application scope is not limited by the example of the present invention. As shown in FIG. 2, the LPCVD 20 includes a reaction furnace, which is often referred to as a furnace tube. The reaction furnace is usually designed as horizontal structure, wherein multi polysilicon wafers to be deposited can be placed in the reaction furnace, in which the atmospheric condition required for the thin film deposition is developed. The reaction furnace further includes furnace opening part 210, furnace tail part 230 and furnace body part 220 therebetween. Wafers are sent into the reaction furnace through an opening of a furnace opening part 110. Specifically, wafer cassettes 900 are used to carry wafers 910 to easily go into or out of the reaction furnaces. As shown in FIG. 2, during the film growth, the wafer cassette 900 carrying wafers 910 is placed between the furnace opening part 210 and furnace tail part 230, that is, at the furnace body part. Meanwhile, a port is arranged at the furnace tail part 230 to connect a vacuum pump to vacuum the reaction furnace after the wafers 910 are placed into the reaction furnace but before the reaction gas is ventilated As also shown in FIG. 2, a reaction gas input pipeline 240 is arranged at the furnace opening part 210 while a reaction gas input pipeline 250 is arranged at the furnace tail 230, such that during the thin film deposition, the reaction gas, such as silane SiH4, can be input through the reaction gas input pipelines 240 and 250 at the same time. As such, the problem is avoided that the concentration of the reaction gas for the wafers close to the furnace tail are relatively low when the reaction gas is only input at the furnace opening part 210, therefore the concentration difference of the reaction gas among the wafers located at the furnace body part is greatly decreased and internal atmosphere is more evenly and consistently, thereby finally resulting in better consistency of the thin films between the wafers 910 carried by the same wafer cassette 900. For example, the thickness of the polysilicon thin films deposited on each wafers is tend to be more consistent. In this way, the number of the wafers placed in the reaction furnace in one batch can be increased. Specifically the wafer number of one batch can be arranged from 150 to 200, such as 180 or up to 200, thereby greatly increasing production efficiency of LPCVD and reducing thin film deposition cost per wafer.

It should be noted that, although the kinds of the reaction gases input through the reaction gas input pipelines 240 and 250 can be the same, the specific flow amounts of the gases through different pipelines can be different. Specifically, the gases input through the reaction gas input pipelines 240 and 250 can be selected and set according to distance difference of the wafer cassette to the furnace opening part and to the furnace tail part. In addition, this embodiment only shows the situation that one kind of reaction gas ($SiH_4$) passes through one pair of pipelines (240 and 250). When several kinds of reaction gases are required, several pairs of pipelines can be arranged both at the furnace opening part 210 and at furnace tail part 230 correspondingly. For example, when there are two kinds of reaction gases, two reaction gas input pipelines are arranged at the furnace opening part 210 to input two kinds of reaction gases respectively and two reaction gas input pipelines are arranged at the furnace tail part 230 to input two kinds of reaction gases respectively.

Specifically, the reaction gas input pipeline 240 can be arranged with a flowmeter 241 and a pneumatic valves 242, wherein the flowmeter 241 is used to control the input reaction gas flow amount through the reaction gas input pipeline 240, and the pneumatic valves 242 is used to control whether the reaction gas pipeline is open, i.e. determining whether the reaction gas goes into the reaction furnace. Similarly, the reaction gas input pipeline 250 can be arranged with a flow meter 251 and a pneumatic valves 252, wherein the flowmeter 251 is used to control the input reaction gas flow amount through the reaction gas input pipeline 250, and the pneumatic valves 252 is used to control whether the reaction gas pipeline is open.

As can be seen from the above, when the LPCVD apparatus is used for the semiconductor thin film deposition, the thin film deposition can be accomplished under a condition of substantially the same temperature for the wafers in same one batch, and grain size consistency of the thin films between the wafers is relatively better.

It should be understood that, when the LPCVD apparatus as shown in FIG. 2 is used for the semiconductor thin film deposition, the specific process parameters can be set according to specific situation; improvement of the method for thin film deposition of the present invention mainly lies in the input mode of the reaction gas, therefore, the specific process parameters are not detailed hereby.

The above example mainly illustrates the LPCVD apparatus of the present invention and the method for thin film deposition using the LPCVD apparatus. Although only some embodiments of the present invention are described, those skilled in the art should understand that the present invention can be implemented by many other embodiments without departing from tenet and scope of the present invention. Thus, the examples and the embodiments as shown should be regarded as illustrative and not restrictive. The present invention may encompass various modification and alternation without departing from the spirit and scope of the present invention.

The invention claimed is:

1. A low-pressure chemical vapor deposition apparatus, including a reaction furnace designed as a horizontal structure, wherein the reaction furnace comprises a furnace opening part side, a furnace body part side and a furnace tail part side, and wherein the furnace body part side is a part between the furnace opening part side and the furnace tail part side and is used for depositing multiple polysilicon wafers which are placed vertically in the reaction furnace, and a port is arranged at the furnace tail part side to connect a vacuum pump to vacuum the reaction furnace, wherein the reaction gas input pipelines are arranged at both end sides of the horizontal structure of the reaction furnace which are the furnace opening part side and the furnace tail part side such that during a thin film deposition, the reaction gas can be input through the reaction gas input pipelines at the same time, and wherein the reaction gas input pipelines at the furnace opening part side and the reaction gas input pipelines at the furnace tail part side are arranged toward the wafers from directly opposite directions, and further wherein, said apparatus is configured for the thin film deposition directly on said polysilicon wafers and further wherein, when said apparatus is used for the thin film deposition:

1) a synchronous introduction of a reaction gas into said reaction furnace through the input pipelines at the furnace opening part side and the furnace tail part side is enabled; and 2) there is no substantial temperature difference between said furnace opening part side and said furnace tail part side.

2. The low pressure chemical vapor deposition apparatus according to claim 1, wherein when there are n kinds of reaction gases for the chemical vapor deposition, n reaction gas input pipelines are arranged at both the furnace opening part side and the furnace tail part side, wherein n is an integer equal to 1 or greater.

3. The low pressure chemical vapor deposition apparatus according to claim 1, wherein each of the reaction gas input pipelines is arranged with a pneumatic valve.

4. The low pressure chemical vapor deposition apparatus according to claim 1, wherein each of the reaction gas input pipelines is arranged with a flowmeter.

5. The low pressure chemical vapor deposition apparatus according to claim 1, wherein the wafers are carried by a wafer cassette.

6. The low pressure chemical vapor deposition apparatus according to claim 1, wherein the number of the multi wafers is ranged from 150 to 200.

7. A method for thin film deposition, wherein the low pressure chemical vapor deposition apparatus according to claim 1 is used to deposit thin films on the multi wafers, wherein each of the reaction gases is synchronously introduced into the reaction furnace through the input pipelines at the furnace opening part side and the furnace tail part side.

8. The method for thin film deposition according to claim 7, wherein the thin films are polysilicon thin films.

9. The method for thin film deposition according to claim 8, wherein the reaction gas is $SiH_4$.

10. The method for thin film deposition according to claim 7, wherein the number of the multi wafers is arranged from 150 to 200.

11. The method for thin film deposition according to claim 7, wherein each of the reaction gas input pipelines is arranged with a pneumatic valve to control flow amount of the reaction gas.

* * * * *

UNITED STATES PATENT AND TRADEMARK OFFICE
CERTIFICATE OF CORRECTION

PATENT NO. : 9,478,440 B2  
APPLICATION NO. : 14/363719  
DATED : October 25, 2016  
INVENTOR(S) : Xunhui Wang et al.

Page 1 of 1

It is certified that error appears in the above-identified patent and that said Letters Patent is hereby corrected as shown below:

On the Title Page

(73) Assignee: "University of Utah Research Foundation (US)" should be -- Wuxi China Resources Huajing Microelectronics Co., Ltd. (CN) --

Signed and Sealed this
First Day of August, 2017

Joseph Matal
*Performing the Functions and Duties of the
Under Secretary of Commerce for Intellectual Property and
Director of the United States Patent and Trademark Office*